United States Patent
Liu et al.

(10) Patent No.: US 9,505,611 B1
(45) Date of Patent: Nov. 29, 2016

(54) INTEGRATION OF ELECTROMECHANICAL AND CMOS DEVICES IN FRONT-END-OF-LINE USING REPLACEMENT METAL GATE PROCESS FLOW

(71) Applicant: GLOBALFOUNDRIES Inc., Grand Cayman (KY)

(72) Inventors: Fei Liu, Yorktown Heights, NY (US); Qiqing C. Ouyang, Yorktown Heights, NY (US); Keith Kwong Hon Wong, Wappingers Falls, NY (US)

(73) Assignee: GLOBAL FOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/814,083

(22) Filed: Jul. 30, 2015

(51) Int. Cl.
*B81C 1/00* (2006.01)
*H01L 29/66* (2006.01)
*B81B 7/00* (2006.01)

(52) U.S. Cl.
CPC ........... *B81C 1/00246* (2013.01); *B81B 7/008* (2013.01); *H01L 29/66545* (2013.01); *B81B 2203/0118* (2013.01); *B81B 2207/015* (2013.01); *B81B 2207/07* (2013.01); *B81C 2201/0132* (2013.01); *B81C 2201/056* (2013.01); *B81C 2203/0714* (2013.01)

(58) Field of Classification Search
None
See application file for complete search history.

(56) References Cited

U.S. PATENT DOCUMENTS 5,638,946 A * 6/1997 Zavracky ............... G11C 23/00
200/181

7,075,393 B2 * 7/2006 Majumder ......... H01H 59/0009
200/181

(Continued)

FOREIGN PATENT DOCUMENTS

CN 1595633 A 3/2005
CN 101875480 A 11/2010
(Continued)

OTHER PUBLICATIONS

English translation for Chinese Application No. CN101875480B.
(Continued)

*Primary Examiner* — Mary Wilczewski
*Assistant Examiner* — Erik T Peterson
(74) *Attorney, Agent, or Firm* — Scully Scott Murphy and Presser; Frank Digiglo

(57) ABSTRACT

Semiconductor devices and methods are provided for integrally forming electromechanical devices (e.g. MEMS or NEMS devices) with CMOS devices in a FEOL (front-end-of-line) structure as part of a replacement metal gate process flow. For example, a method includes forming an electromechanical device in a first device region of a substrate and forming a transistor device in a second device region of the substrate. The electromechanical device includes a sacrificial anchor structure and a sacrificial cantilever structure formed of a sacrificial material. The transistor device includes a sacrificial gate electrode structure formed of the sacrificial material. A replacement metal gate process is performed to replace the sacrificial gate electrode structure of the transistor device with a metallic gate electrode, and to replace the sacrificial anchor structure and the sacrificial cantilever structure with a metallic anchor structure and a metallic cantilever structure. A release process is performed to release the metallic cantilever structure.

14 Claims, 11 Drawing Sheets

(56) References Cited

U.S. PATENT DOCUMENTS

| | | |
|---|---|---|
| 8,692,338 B2 | 4/2014 | Wang et al. |
| 8,704,315 B2 | 4/2014 | Parpia et al. |
| 8,823,007 B2 | 9/2014 | Yang |
| 8,927,312 B2 * | 1/2015 | Chang ................ H01L 29/7827 257/414 |
| 2003/0015768 A1 | 1/2003 | Bosco et al. |
| 2010/0258882 A1 | 10/2010 | Magnee et al. |
| 2011/0140216 A1 | 6/2011 | Qu |
| 2014/0103422 A1 | 4/2014 | Chang et al. |
| 2014/0106552 A1 | 4/2014 | Chang et al. |
| 2014/0225250 A1 | 8/2014 | Montanya Silvestre et al. |
| 2014/0264474 A1 | 9/2014 | Chu et al. |

FOREIGN PATENT DOCUMENTS

| | | |
|---|---|---|
| CN | 103824813 A | 5/2014 |
| CN | 101875480 B | 9/2014 |

OTHER PUBLICATIONS

English translation for Chinese Application No. CN1595633A.

* cited by examiner

INTEGRATION OF ELECTROMECHANICAL AND CMOS DEVICES IN FRONT-END-OF-LINE USING REPLACEMENT METAL GATE PROCESS FLOW

TECHNICAL FIELD

This disclosure relates generally to semiconductor fabrication techniques and, in particular, to structures and methods for co-integration of electromechanical devices and CMOS (complementary metal oxide semiconductor) devices.

BACKGROUND

Various techniques have been developed for integrating electromechanical devices such as MEMS (microelectromechanical system) devices or NEMS (nanoelectromechanical system) devices with integrated circuitry to construct different types of electronic systems. The integration of electromechanical devices with CMOS circuitry is desirable in various applications to achieve more functionality with reduced power consumption and/or to provide a readout circuit for the electromechanical devices. For example, resonant electromechanical devices can be utilized in RF (radio frequency) applications as frequency and phase determining elements that process or generate electrical signals in communication systems. The co-fabrication of electromechanical devices in a CMOS integrated circuit can be realized by incorporating separate MEMS/NEMS processing steps before or after the steps of a given CMOS fabrication process flow. In general, fabrication techniques for the co-integration of electromechanical devices and CMOS devices include SOI (silicon-on-insulator)-based integration techniques, or BEOL (back-end-of-line)-based integration techniques.

SUMMARY

Embodiments of the present disclosure include semiconductor devices and methods for integrally forming electromechanical devices (e.g. MEMS or NEMS devices) with CMOS devices in a FEOL (front-end-of-line) structure as part of a replacement metal gate process flow.

For example, one embodiment of the disclosure includes a method of forming a semiconductor device. The method includes forming an electromechanical device in a first device region of a substrate and forming a transistor device in a second device region of the substrate. The electromechanical device includes a sacrificial anchor structure and a sacrificial cantilever structure formed of a sacrificial material. The transistor device includes a sacrificial gate electrode structure formed of the sacrificial material. A replacement metal gate process is performed to replace the sacrificial gate electrode structure of the transistor device with a metallic gate electrode, and to replace the sacrificial anchor structure and the sacrificial cantilever structure with a metallic anchor structure and a metallic cantilever structure. A release process is performed to release the metallic cantilever structure.

Another embodiment of the disclosure includes a semiconductor device. The semiconductor device includes a semiconductor substrate and a FEOL structure formed on the semiconductor substrate. The FEOL structure includes an electromechanical device formed in a first device region of the semiconductor substrate, and a transistor device formed in a second device region of the semiconductor substrate. The electromechanical device includes a metallic anchor structure and a metallic cantilever structure, and the transistor device includes a metallic gate electrode. The metallic gate electrode of the transistor device and the metallic anchor structure and the metallic cantilever structure of the electromechanical device are disposed in a same metallization level of the FEOL structure.

These and other embodiments will be described in the following detailed description of embodiments, which is to be read in conjunction with the accompanying figures.

BRIEF DESCRIPTION OF THE DRAWINGS

FIGS. 12A and 12B schematically illustrate a method to release cantilever structures of electromechanical devices in the electromechanical device region of the substrate, according to an embodiment of the disclosure, wherein:

FIG. 12A is a schematic cross-sectional side view of the semiconductor structure of FIG. 11 after patterning the one or more layers of metallic material to form local interconnect structures between devices in the CMOS and electromechanical device regions; and FIG. 12B is a schematic cross-sectional side view of the semiconductor structure of FIG. 12A after removing insulating material through an opening formed in a portion of the patterned layer of metallic material in the electromechanical device region to release the electromechanical devices.

FIGS. 13A, 13B, 13C, and 13D schematically illustrate a method to release cantilever structures of electromechanical devices in the electromechanical device region of the substrate, according to another embodiment of the disclosure, wherein:

FIG. 13A is a schematic cross-sectional side view of the semiconductor structure of FIG. 11 after planarizing the semiconductor structure down to the insulating layer to remove the layers of metallic material and dielectric material, and sequentially depositing an insulating layer and a nitride layer on the planarized semiconductor structure; and FIG. 13B is a schematic cross-sectional side view of the semiconductor structure of FIG. 13A after forming via contacts to the metallic gate electrodes and the source/drain regions of transistor devices in the CMOS device region of the substrate;

FIG. 13C is a schematic cross-sectional side view of the semiconductor structure of FIG. 13B after forming a vent hole opening in the electromechanical device region of the substrate; and FIG. 13D is a schematic cross-sectional side view of the semiconductor structure of FIG. 13C after removing insulating material through the vent hole opening to release the cantilever structures of electromechanical devices in the electromechanical device region of the substrate.

FIGS. 14A, 14B, 14C, 14D, 14E, and 14F schematically illustrate a method to release cantilever structures of electromechanical devices in the electromechanical device region of the substrate, according to yet another embodiment of the disclosure, wherein:

FIG. 14A is a schematic cross-sectional side view of the semiconductor structure of FIG. 13B after forming a guard ring opening around an electromechanical device structure in the electromechanical device region of the substrate;

FIG. 14B is a top plan schematic view of the electromechanical device region taken along line 14B-14B in FIG. 14A, showing the guard ring opening formed around the electromechanical device structure;

FIG. 14C is a schematic cross-sectional side view of the semiconductor structure of FIG. 14A after filling the guard ring opening with an insulating material to form a guard ring around the electromechanical device structure in the electromechanical device region of the substrate;

FIG. 14D is a schematic cross-sectional side view of the semiconductor structure of FIG. 14C after forming a vent hole opening in the electromechanical device region of the substrate;

FIG. 14E is a schematic cross-sectional side view of the semiconductor structure of FIG. 14D after removing insulating material through the vent hole opening to release the cantilever structure of an electromechanical device in the electromechanical device region of the substrate; and FIG. 14F is a schematic cross-sectional side view of the semiconductor structure of FIG. 14E after depositing an insulating layer to seal the vent hole and forming via contacts as part of a first level of a back-end-of-line process.

DETAILED DESCRIPTION OF EMBODIMENTS

Embodiments of the present disclosure will now be described in further detail with regard to techniques for integrally forming electromechanical devices (e.g. MEMS or NEMS devices) with CMOS devices in a FEOL structure as part of a replacement metal gate process flow. It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

Figure 1:
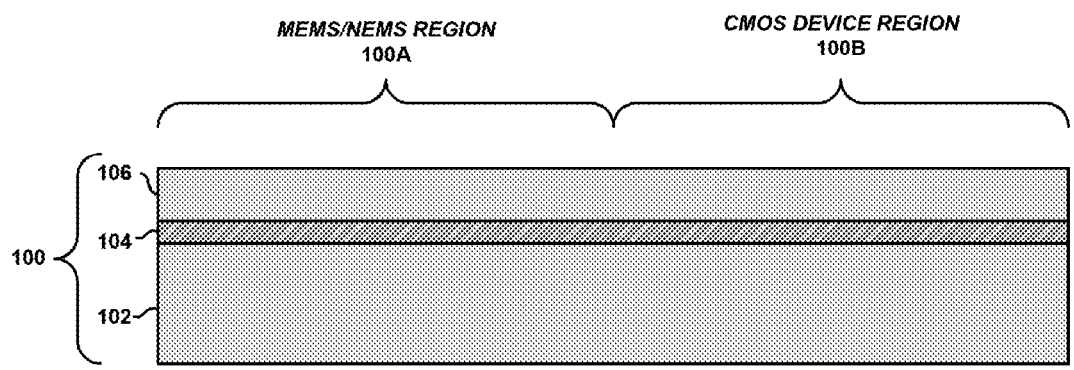
FIG. 1 is a schematic cross-sectional side view of a semiconductor structure at an initial stage of fabrication starting with a silicon-on-insulator substrate, according to an embodiment of the disclosure.

Methods for fabricating semiconductor devices having integrated CMOS and electromechanical devices will now be discussed in further detail with reference to FIGS. 1~11, 12A~B, 13A~D, and 14A~F, which schematically illustrate various stages of fabrication of a semiconductor device. FIG. 1 is a schematic cross-sectional side view of a semiconductor structure at an initial stage of fabrication starting with a silicon-on-insulator substrate 100, according to an embodiment of the disclosure. As shown in FIG. 1, the substrate 100 includes a base substrate layer 102, an insulating layer 104 (e.g., buried oxide layer) and an active semiconductor layer 106 (or SOI layer 106). The insulating layer 104 isolates the active semiconductor layer 106 from the base substrate 102.

The base substrate 102 may be made from any of several known semiconductor materials such as, for example, silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. The thickness of the base substrate 102 will vary depending on the application. For example, the base substrate 102 may have a thickness in a range of about 0.5 mm to about 1.5 mm.

The insulating layer 104 may be formed of any dielectric or insulating material which is suitable for the given application. For example, the insulating layer 104 may be formed of material such as, for example, oxides, nitrides, oxynitrides of silicon, and combinations thereof. In addition, the insulating layer 104 may include crystalline or non-crystalline dielectric material. In one embodiment, the insulating layer 104 has a thickness in a range of about 100 nm to about 500 nm, for example.

The SOI layer 106 may be made of silicon or other suitable types of semiconductor materials, such as materials used for the base substrate 102. In general, the base substrate 102 and the SOI layer 106 may include either identical or different semiconducting materials with respect to chemical composition, dopant concentration, and crystallographic orientation. The SOI layer 106 may be doped with p-type dopants such as boron or doped with n-type dopants such as phosphorus and/or arsenic. The SOI layer 106 may have a thickness ranging from about 30 nm to about 100 nm, for example.

In another embodiment, the substrate 100 may include a bulk semiconductor substrate formed of, e.g., silicon, or other types of semiconductor substrate materials that are commonly used in bulk semiconductor fabrication processes. As further shown in FIG. 1, the substrate 100 includes one or more electromechanical device regions and one or more CMOS device regions. For ease of illustration and explanation, FIG. 1 (and the following figures) illustrate a portion of one electromechanical (MEMS/NEMS) device region 100A, and a portion of one CMOS device region 100B.

Figure 2:
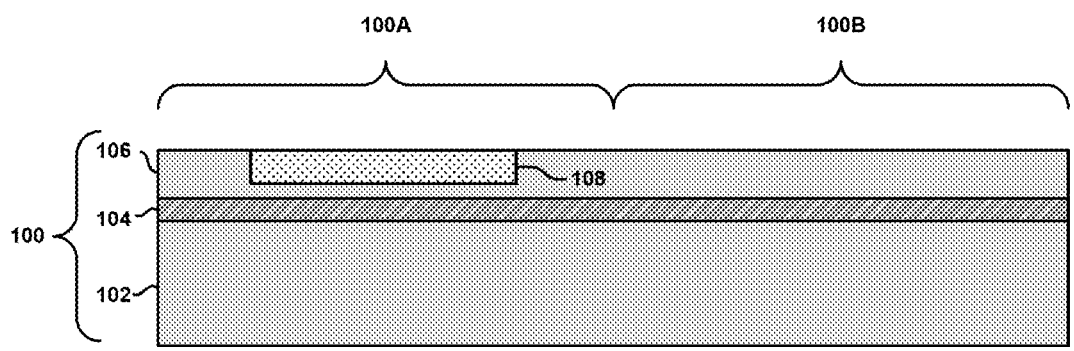
FIG. 2 is a schematic cross-sectional side view of the semiconductor structure of FIG. 1 after forming a doped well in an electromechanical device region of the substrate, according to an embodiment of the disclosure.

A next step in the illustrative process flow is to form contact structures for electromechanical devices in the surface of the substrate 100. For example, FIG. 2 is a schematic cross-sectional side view of the semiconductor structure of FIG. 1 after forming a doped well 108 for an electromechanical device in the electromechanical region 100A of the substrate, according to an embodiment of the disclosure. In one embodiment, the doped well 108 is formed using an ion implantation process in which dopant ions are accelerated in an electrical field and impacted into the surface of the substrate 100. The energy of the dopant ions, as well as the ion species and the material composition of the substrate surface will determine the depth of penetration of the ions into the substrate surface.

As shown in FIG. 2, the doped well 108 is formed in the SOI layer 106 of the substrate 100. Depending on the application, the doped well 108 can be an n-well that is formed by ion implanting a n-type dopant species (e.g., phosphorus or arsenic) into the substrate 100, or a p-well that is formed by ion implanting a p-type dopant species (e.g., boron) into the substrate 100, using known techniques. It is to be understood that the process of forming the doped well 108 in the substrate 100 is an optional step that is performed only when the electromechanical device contacts are to be formed in the substrate 100 for the given design. In other embodiments, electromechanical device contacts can be formed above the cantilever components of the electromechanical devices (e.g., in a BEOL structure).

Figure 3:
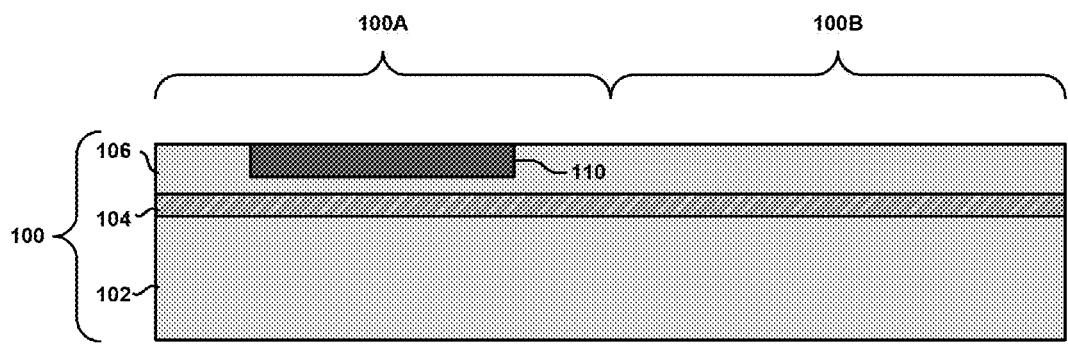
FIG. 3 is a schematic cross-sectional side view of the semiconductor structure of FIG. 2 after siliciding the doped well, according to an embodiment of the disclosure.

After forming the doped wells 108, a standard process may be implemented, e.g., a silicidation process, to convert the doped wells 108 to silicide contacts. For example, FIG. 3 is a schematic cross-sectional side view of the semiconductor structure of FIG. 2 after siliciding the doped well 108 to form an ohmic silicide contact 110, according to an embodiment of the disclosure. In one embodiment, a silicidation process is implemented to form high melting point silicide contacts which can withstand thermal temperatures of more than 1000 degrees Celsius. For example, the ohmic silicide contact 110 may be a high temperature Co-silicide contact or a high temperature Ti-silicide contact, which are formed using known techniques. Other techniques may be implemented to convert the doped wells 108 to ohmic contacts.

Figure 4:
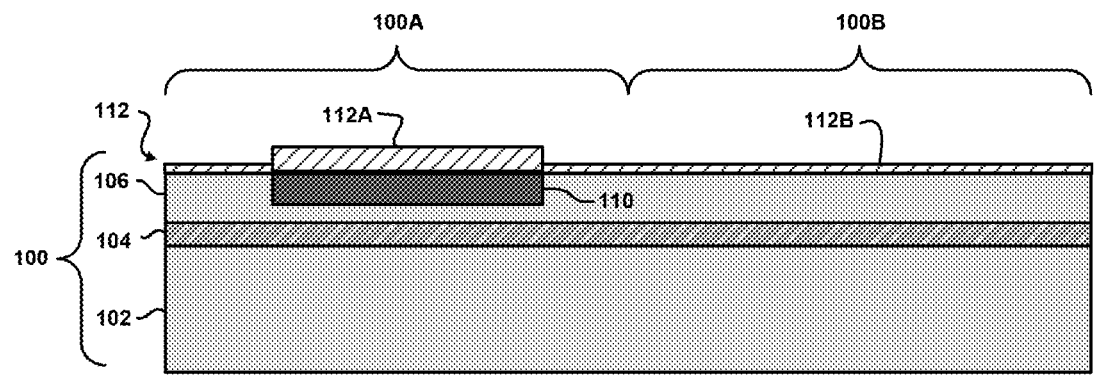
FIG. 4 is a schematic cross-sectional side view of the semiconductor structure of FIG. 3 after forming an insulating layer in the electromechanical and CMOS device regions of the substrate, according to an embodiment of the disclosure.

A next step in the exemplary process is to form an insulating layer over the device regions 100A and 100B of the substrate 100. For example, FIG. 4 is a schematic cross-sectional side view of the semiconductor structure of FIG. 3 after forming an insulating layer 112 over the surface of the substrate 100, according to an embodiment of the disclosure. In one embodiment, the insulating layer 112 is formed of an oxide material, such as silicon oxide. As shown in FIG. 4, the insulating layer 112 includes a first portion 112A formed on the ohmic contact 110, and a second portion 112B formed on the remaining surface area of the SOI layer 106.

As shown in FIG. 4, the first portion 112A of the insulating layer 112 is thicker than the second portion 112B of the insulating layer 112. As explained in further detail below, the thickness of the first portion 112A of the insulating layer 112 defines a gap distance between a cantilever component of an electromechanical device and the ohmic contact 110. In one embodiment of the disclosure, the first portion 112A of the insulating layer 112 has a thickness in a range of about 1 nm to about 1000 nm. In addition, the thickness of the second portion 112B of the insulating layer 112 defines a thickness of a gate oxide layer for FET devices that are formed in the CMOS device region 100B. Furthermore, in one embodiment of the disclosure, the second portion 112B of the insulating layer 112 has a thickness in a range of about 1 nm to about 100 nm.

The insulating layer 112 may be formed by blanket depositing a thick layer of insulating material over the device regions 100A and 100B, etching away the portion of the insulating material which does not cover the ohmic contacts 110, and then depositing a second layer of insulating material to form the second portion 112B of the insulating layer 112. In this second deposition step, additional insulating material may be deposited on the existing insulating material disposed over the ohmic contact 110 such that the total thickness of the first portion 112A of the insulating layer 112 is defined by the insulating material deposited during the first and second deposition steps.

Figure 5:
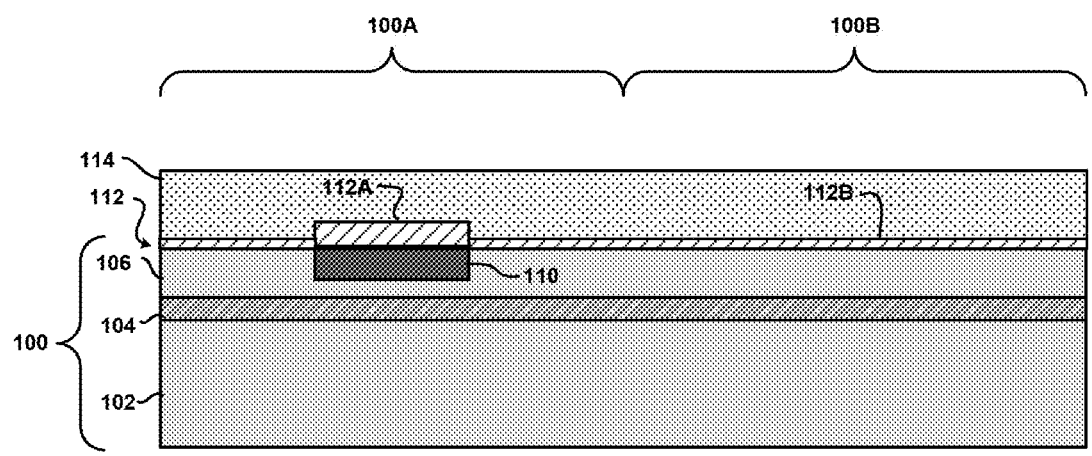
FIG. 5 is a schematic cross-sectional side view of the semiconductor structure of FIG. 4 after depositing a layer of sacrificial material, according to an embodiment of the disclosure.

A next step in the exemplary process is to form sacrificial structures for the CMOS and electromechanical devices. For example, as an initial step, a layer of sacrificial material is deposited and patterned to form sacrificial (dummy) anchor and cantilever structures for electromechanical devices in the device region 100A, as well as sacrificial (dummy) gate structures for FET devices in the device region 100B. More specifically, FIG. 5 is a schematic cross-sectional side view of the semiconductor structure of FIG. 4 after depositing a layer of sacrificial material 114, according to an embodiment of the disclosure. In one embodiment, the layer of sacrificial material 114 includes a layer of polysilicon, which can be doped or undoped. The layer of sacrificial material 114 can be formed by depositing a blanket layer of sacrificial material using any suitable deposition technique known in the art, including atomic layer deposition (ALD), chemical vapor deposition (CVD), physical vapor deposition (PVD), or molecular beam deposition (MBD), for example.

After the layer of sacrificial material 114 is deposited, a CMP (chemical-mechanical planarization) process is performed to planarize the surface of the sacrificial material 114. In one embodiment of the disclosure, the resulting planarized layer of sacrificial material 114 has a thickness in a range of about 10 nm to about 5000 nm, for example. Thereafter, the layer of sacrificial material 114 is patterned (via a suitable lithographic process and etch process) to form sacrificial structures for the electromechanical devices and CMOS devices in the device regions 100A and 100B.

Figure 6:
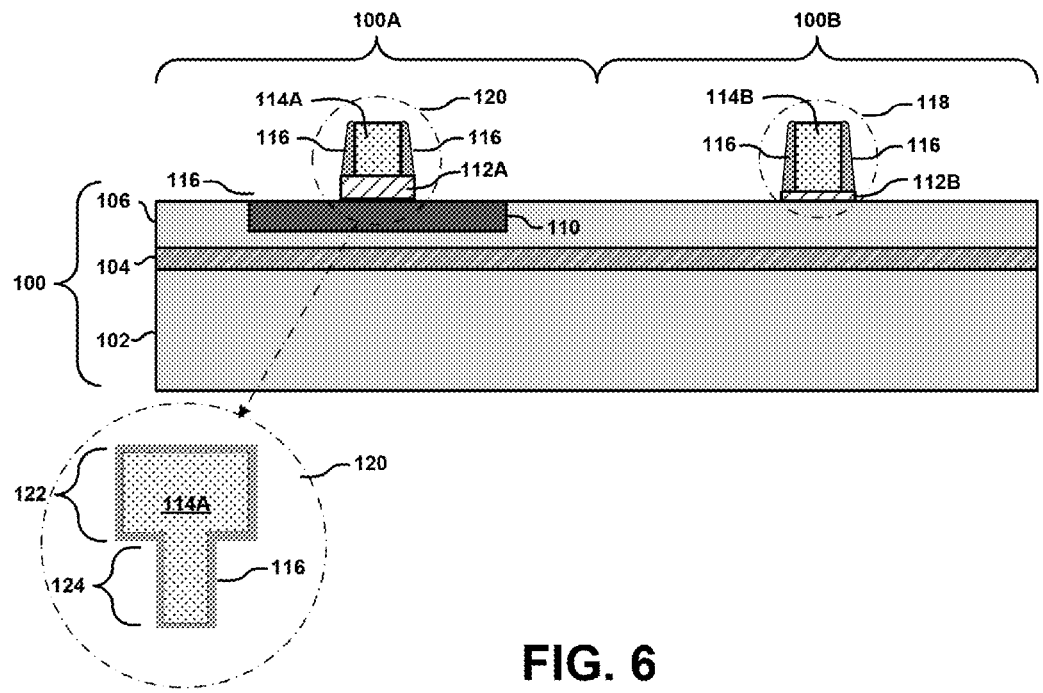
FIG. 6 is a schematic cross-sectional side view of the semiconductor structure of FIG. 5 after forming an electromechanical device including sacrificial anchor and cantilever structures and forming a gate structure including a sacrificial gate electrode structure, according to an embodiment of the disclosure.

For example, FIG. 6 is a schematic cross-sectional side view of the semiconductor structure of FIG. 5 after patterning the layer of sacrificial material 114 to form sacrificial structures 114A and 114B in the device regions 100A and 100B, respectively, and forming sidewall spacers 116 on sidewalls of the sacrificial structures 114A and 114B, according to an embodiment of the disclosure. More specifically, FIG. 6 illustrates a stage of fabrication in which a gate structure 118 is formed in the CMOS device region 100B, and an electromechanical device structure 120 is formed in the electromechanical device region 100A. As shown in FIG. 6, the gate structure 118 includes a sacrificial gate electrode structure 114B, sidewall spacers 116 formed on the sacrificial gate electrode structure 114B, and a gate insulating layer 112B which is formed by patterning the thin insulating layer 112B.

The electromechanical device structure 120 includes a sacrificial structure 114A, sidewalls spacers 116 formed on the sidewalls of the sacrificial structure 114A, and a sacrificial insulating layer 112A which is formed by patterning the thick insulating layer 112A. As further shown by an exploded top view of the device 120 shown within the dashed-line circle illustrated in FIG. 6, the sacrificial structure 114A defines an anchor structure 122 and a cantilever structure 124, which are initially formed by patterning the sacrificial material 114. The anchor structure 122 (and associated portion of the sidewall spacer 116) is formed down to the substrate 110, whereas the cantilever structure 124 (and associated portion of the sidewall spacer 116) is formed on top of the sacrificial insulating layer 112A. As discussed in further detail below, the sacrificial material forming the anchor structure 122 and cantilever structure 124 is replaced with metallic material as part of a replacement metal gate process.

The structure shown in FIG. 6 can be fabricated as follows. As an initial step, the layer of sacrificial material 114 shown in FIG. 5 can be patterned using a standard photolithographic process, for example, where a layer of photoresist material is deposited on top of the layer of sacrificial material 114 and lithographically patterned (exposed and developed) to form a photoresist mask having a target pattern which defines a pattern of the sacrificial structures 114A and 114B to be to be transferred to the layer of sacrificial material 114. An etch process is then performed using the photoresist mask to etch exposed portions of the layer of sacrificial material 114 down to the insulating layer 112, and thereby form the sacrificial structures 114A and 114B. The etch process can be performed using a dry etch process such as RIE (reactive ion etching) or other anisotropic etch processes with etching chemistries that are suitable to etch the layer of sacrificial material 114.

Following the formation of the sacrificial structures 114A and 114B, one or more deposition and etching processes are performed to form the sidewall spacers 116 on the sidewalls of the sacrificial structures 114A and 114B, and to pattern the insulating layers 112A and 112B to form the insulting structures 112A and 112B. For example, in one embodiment, the sidewall spacers 116 are formed by depositing a conformal layer of dielectric/insulting material (e.g., silicon nitride or other suitable material(s)) using known deposition methods, and then anisotropically etching the conformal layer of dielectric/insulating material to remove portions of the conformal layer on horizontal surfaces of the semiconductor structure to thereby form the sidewalls spacers 116 on vertical surfaces of the sacrificial structures 114A and 114B. Another etch process is then preformed to remove exposed portions of the insulating layers 112A and 112B to form the patterned insulating structures 112A and 112B. The etch processes that are used to pattern the sidewall spacers 116 and insulating structures 112A and 112B are performed using etch chemistries that are selective to the sacrificial material forming the sacrificial structures 114A and 114B so as to prevent such structures from being etched away when forming the sidewall spacers 116 and the insulating structures 112A and 112B.

Figure 7:
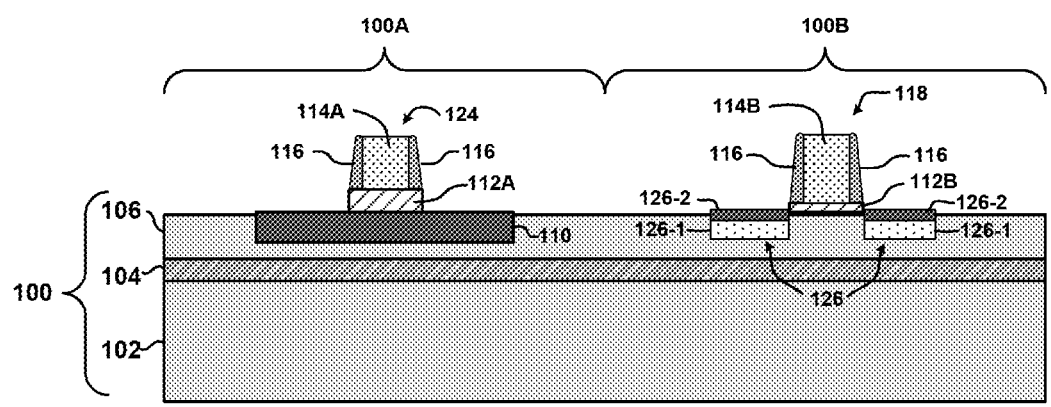
FIG. 7 is a schematic cross-sectional side view of the semiconductor structure of FIG. 6 after forming source and drain regions of transistor devices in the CMOS device region of the substrate, according to an embodiment of the disclosure.

A next step in the example fabrication process includes forming source and drain regions for CMOS devices in the device region 100B. For example, FIG. 7 is a schematic cross-sectional side view of the semiconductor structure of FIG. 6 after forming source and drain regions 126 adjacent to the gate structure 118 in the device region 100B of the substrate 100, according to an embodiment of the disclosure. In one embodiment, the source/drain regions 126 include doped regions 126-1 and ohmic contacts 126-2. For example, the doped regions 126-1 can be p-type or n-typed doped regions that are formed in the SOI layer 106 using ion implantation techniques. The ohmic contacts 126-2 can be silicide layers that are formed by siliciding an upper surface region of the doped regions 126-1. Techniques for fabricating the source/drain regions 126 are well known to those of ordinary skill in the art.

Figure 8:
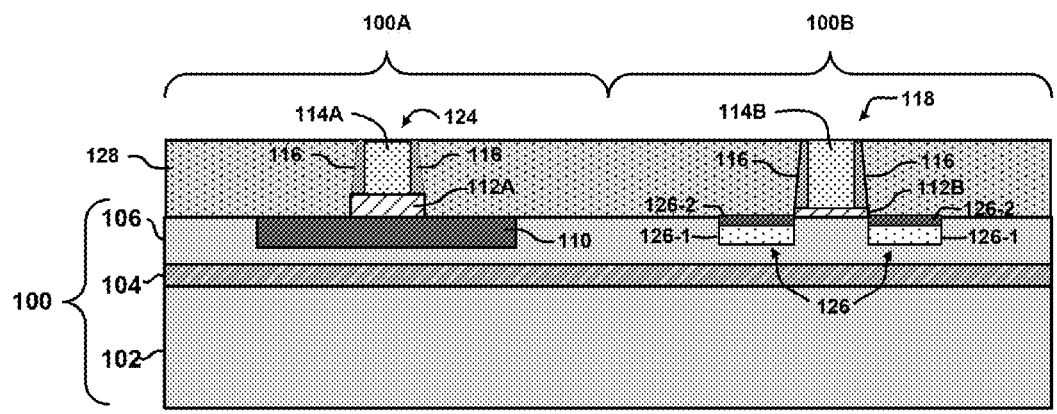
FIG. 8 is a schematic cross-sectional side view of the semiconductor structure of FIG. 7 after blanket depositing a layer of insulating material and planarizing the layer of insulating material to expose the sacrificial structures, according to an embodiment of the disclosure.

Following formation of the source and drain regions 126, a replacement metal gate process is performed to replace the sacrificial structures 114A and 114B in the device regions 100A and 100B with actual structures that form the electromechanical and CMOS devices. In one embodiment of the disclosure, a process flow for performing this stage of fabrication is schematically illustrated by FIGS. 8, 9, 10, and 11. In particular, as an initial step, FIG. 8 is a schematic cross-sectional side view of the semiconductor structure of FIG. 7 after blanket depositing and planarizing a layer of insulating material 128 to expose the sacrificial structures 114A and 114B, according to an embodiment of the disclosure.

In one embodiment, the layer of insulating material 128 may be formed of any suitable material such as, e.g., silicon oxide, silicon nitride, hydrogenated silicon carbon oxide, silicon based low-k dielectrics, porous dielectrics, or organic dielectrics including porous organic dielectrics. In addition, the layer of insulating material 128 may be deposited using known deposition techniques, such as, for example, ALD, CVD, PECVD, PVD, or spin on deposition techniques. Moreover, the layer of insulating material 128 may be etched/planarized using a CMP process, for example, wherein the surface of the semiconductor structure is planarized down to expose the upper surfaces of the sacrificial structures 114A and 114B.

Figure 9:
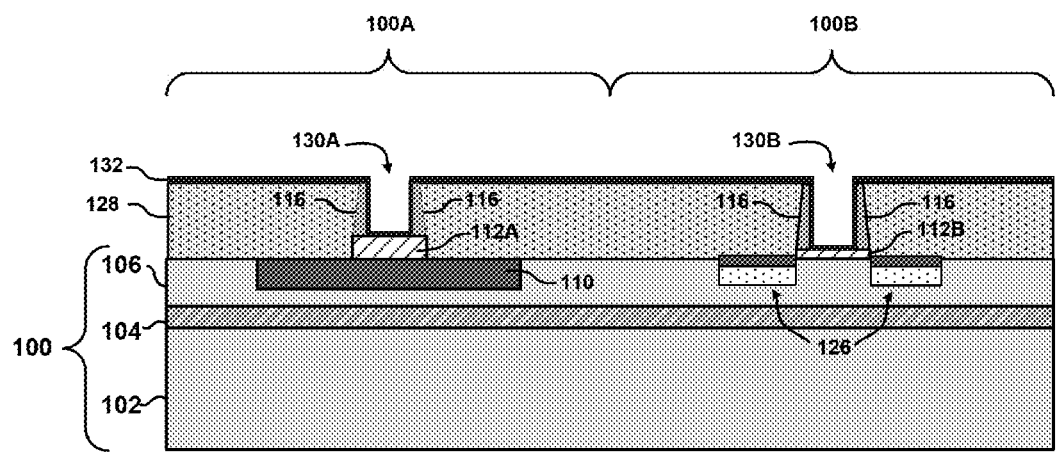
FIG. 9 is a schematic cross-sectional side view of the semiconductor structure of FIG. 8 after removing the sacrificial structures in the CMOS and electromechanical device regions and depositing a conformal layer of dielectric material, according to an embodiment of the disclosure.

After the layer of insulating material 128 is planarized, an etch process is performed to etch away the sacrificial structures 114A and 114B down to the insulating structures 112A and 112B and form recessed regions 130A and 130B, respectively, as shown in FIG. 9. In particular, FIG. 9 is a schematic cross-sectional side view of the semiconductor structure of FIG. 8 after removing the sacrificial structures 114A and 114B and depositing a conformal layer of dielectric material 132, according to an embodiment of the disclosure.

In one embodiment, a selective etch process is performed to remove the sacrificial structures 114A and 114B selective to the insulating layer 128 and spacers 116, so as to avoid etching the insulating layer 128 and spacers 116. The selective etch process may include, for example, an anisotropic etching process such as RIE or plasma etching with an etching chemistry that can selectively remove the sacrificial material (e.g., polysilicon) which forms the sacrificial structures 114A and 114B. As a result of the sacrificial material etch process, the recessed regions 130A and 130B are created in the electromechanical device structure 120 and the gate structure 118, respectively.

Following the sacrificial material etch process, the replacement metal gate process continues with forming the conformal dielectric layer 132, which serves as a gate dielectric layer for CMOS devices in the device region 100B. The conformal dielectric layer 132 can be formed of any insulating/dielectric material which is suitable to serve as a gate dielectric layer for the target application. For example, the conformal dielectric layer 132 may include, e.g., nitride, oxynitride, or oxide or high-k materials such as $SiO_2$, $HfO_2$, $ZrO_2$, $Al_2O_3$, $TiO_2$, $La_2O_3$, $SrTiO_3$, $LaAlO_3$, and mixtures thereof. In one embodiment of the disclosure, the conformal dielectric layer 132 has a thickness in a range of about 0.5 nm to about 10 nm, which will vary depending on the target application. The conformal dielectric layer 132 is deposited using known methods such as ALD, CVD, PVD, or MBD, for example.

Figure 10:
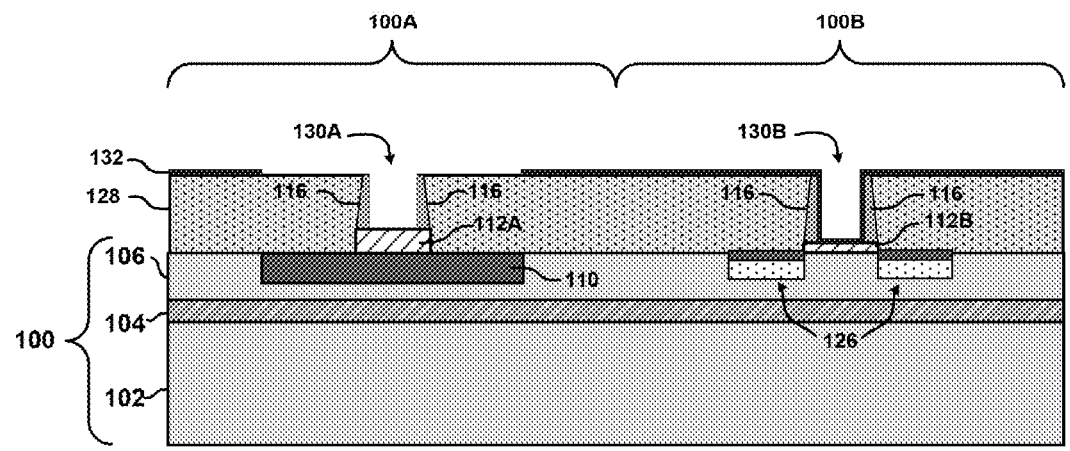
FIG. 10 is a schematic cross-sectional side view of the semiconductor structure of FIG. 9 after removing a portion of the conformal layer of dielectric material in the electromechanical device region, according to an embodiment of the disclosure.

After the conformal dielectric layer 132 is deposited, the replacement metal gate process continues with etching a portion of the conformal dielectric layer 132 in the device region 100A to remove the conformal dielectric layer 132 from within and around the recessed region 130A of the electromechanical device structure 120. For example, FIG. 10 is a schematic cross-sectional side view of the semiconductor structure of FIG. 9 after removing a portion of the conformal dielectric layer 132 in the electromechanical device region 100A, according to an embodiment of the disclosure.

The conformal dielectric layer 132 can be patterned using a standard photolithographic process, for example, where a layer of photoresist material is deposited on top of the conformal dielectric layer 132 and lithographically patterned (exposed and developed) to form a photoresist mask having a target pattern which defines an opening to expose the portions of the conformal dielectric layer 132 to be removed. An etch process is then performed using the photoresist mask to etch away the exposed portions of the conformal dielectric layer 132 and pattern the dielectric layer 132 such as shown in FIG. 10. The etch process can be performed using any suitable isotropic etch process to etch away the exposed portion of the conformal dielectric layer 132 selective to the insulating layer 128, spacers 116 and sacrificial insulating structure 112A. The photoresist mask is then removed using known methods.

Next, the replacement metal gate process continues with a metal gate deposition and fill process, wherein one or more layers of metallic material are deposited to form metallic components for the electromechanical device structures 120 in the device region 100A, and for the gate structures 118 of FETs in the device region 100B. For example, FIG. 11 is a schematic cross-sectional side view of the semiconductor structure of FIG. 10 after depositing one or more layers of metallic material to form metallic anchor and metallic cantilever structures of the electromechanical device structures 120 in the device region 100A, and to form metallic gate electrodes for the gate structures 118 of FETs in the device region 100B, according to an embodiment of the disclosure.

Figure 11:
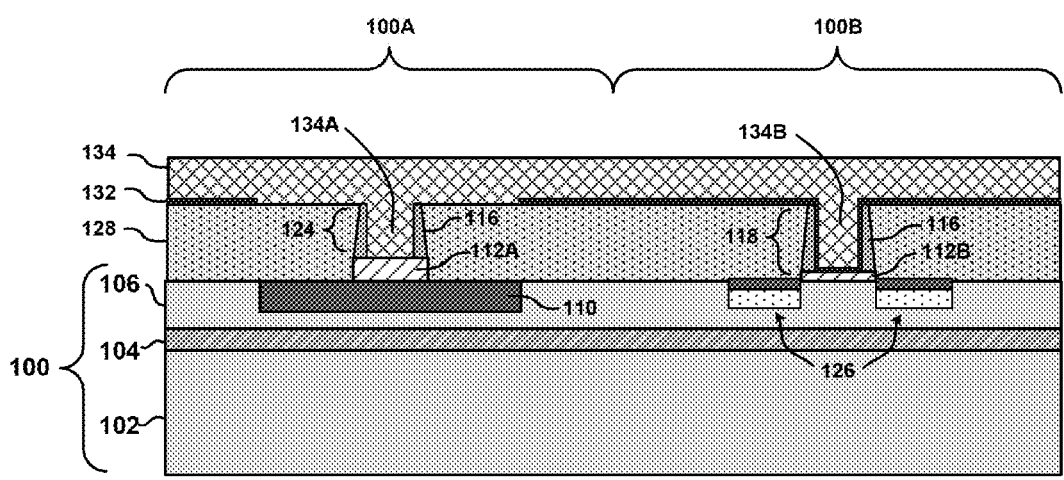
FIG. 11 is a schematic cross-sectional side view of the semiconductor structure of FIG. 10 after depositing one or more layers of metallic material to form a metallic gate electrode and metallic anchor and cantilever structures, according to an embodiment of the disclosure.

More specifically, in one embodiment as shown in FIG. 11, a layer of metallic material 134 is deposited to fill the recessed regions 130A and 130B with metallic material and form metallic anchor and metallic cantilever structures 134A for the electromechanical device structure 120 in the device region 100A, and to form a metallic gate electrode 134B of the gate structure 118 of an FET in the device region 100B. In one embodiment of the disclosure, this process may be implemented by depositing one layer of metallic material which is used to form the metallic components (e.g., anchor point, cantilever, gate electrodes) in the device regions 100A and 100B, followed by a CMP process to planarize the metallic layer.

In another embodiment of the disclosure, when different metallic materials are used to form the metallic anchor and metallic cantilever structures 134A and the metallic gate electrode 134B in the respective device regions 100A and 100B, separate metal deposition and planarization processes can be implemented for the different device regions 100A and 100B. For example, a blocking mask can be formed to cover the electromechanical device region 100A, followed by deposition and planarization of metallic material in the CMOS device region 100B to form the metallic gate electrode 134B, and then removal of the blocking mask. The process is then repeated by forming a blocking mask to cover the CMOS device region 100B, followed by deposition and planarization of metallic material in the electromechanical device region 100A to form the metallic anchor and metallic cantilever structure 134A.

Indeed, in certain applications, the metallic gate electrode 134B may be formed using multiple layers of metallic material including, for example, an initial deposition of a work function metal on the gate dielectric layer 132 within the recessed region 130B, followed by the deposition of a metallic gate electrode layer. For example, the work function metal may include, for example, Zr, W, Ta, Hf, Ti, Al, Ru, Pa, metal oxides, metal carbides, metal nitrides, transition metal aluminides (e.g. $Ti_3Al$, ZrAl), TaC, TiC, TaMgC, or any combination thereof. The work function metal layer can be formed using known methods such as ALD, CVD, PVD, or MBD, for example. Moreover, the metallic gate electrode layer may be formed of tungsten, doped polysilicon material, or any metallic or conductive material that is commonly used to make gate electrode structures. The metallic anchor and metallic cantilever structures 134A can be made using one of various types of metallic materials that are commonly utilized to form MEMS or NEMS devices.

A next step in the illustrative fabrication process is to release the electromechanical devices formed in the device region 100A. In particular, a release process involves removing insulating material surrounding the cantilever structures extending from the associated anchor structures so that the cantilever structures are enabled for mechanical movement. Alternate embodiments of the disclosure for implementing a release process will now be described in further detail with reference to FIGS. 12A~12B, FIGS. 13A~13D, and FIGS. 14A~14F.

Figure 12A:
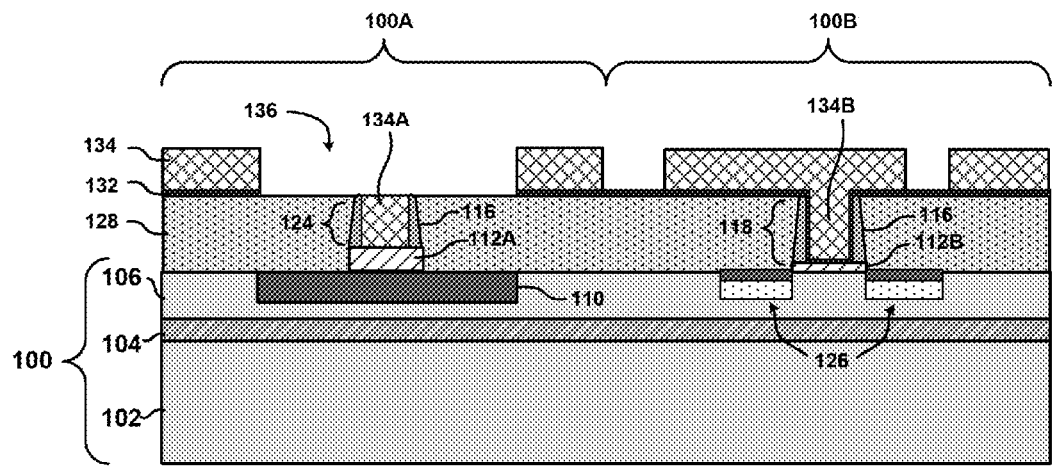
Figure 12B:
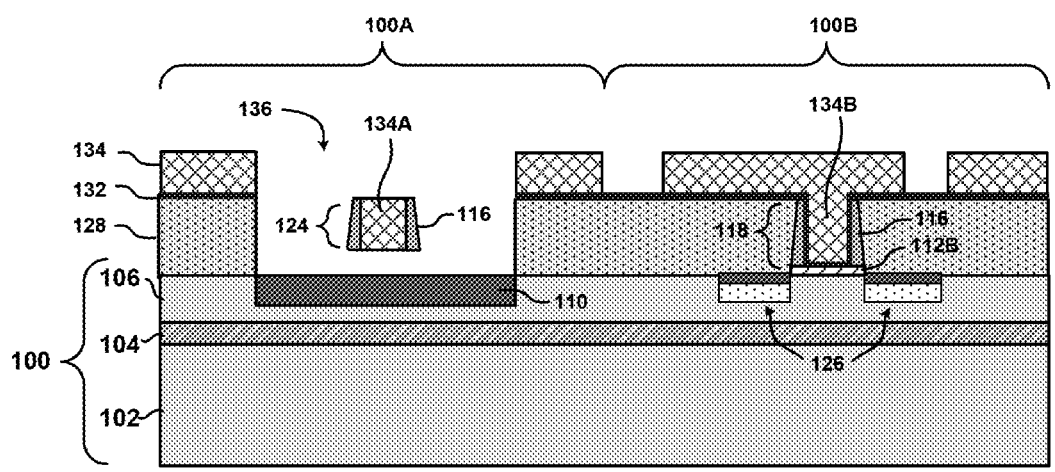

For example, FIGS. 12A and 12B schematically illustrate a method to release electromechanical device structures in the electromechanical device region 100A of the substrate, according to an embodiment of the disclosure. FIG. 12A is a schematic cross-sectional side view of the semiconductor structure of FIG. 11 after patterning the layer of metallic material 134 to form local interconnect structures between devices in the device regions 100A and 100B. In one embodiment, the layer of metallic material 134 can be patterned using a standard subtractive RIE process. As further shown in FIG. 12A, the layer of metallic material 134 is patterned to form a vent opening 136 to expose a portion of the insulating layer 128 in the electromechanical device region 100A which is to be removed so as to physically release the cantilever structure 124.

FIG. 12B is a schematic cross-sectional side view of the semiconductor structure of FIG. 12A after removing insulating material through the vent opening 136 to release the cantilever structure 124 of the electromechanical device 120. In particular, as shown in FIG. 12B, the cantilever structure 124 of the electromechanical device structure 120 is released by etching away a portion of the insulating layer 128 surrounding the cantilever structure 124 and the underlying sacrificial insulting layer 112A. In one embodiment of the disclosure, an etch process to release the cantilever structure 124 is performed by forming an etch mask over the semiconductor structure shown in FIG. 12A which covers the entire surface expect for the vent opening 136. Then, a selective etch process is formed to etch the materials (e.g., silicon oxide) of the insulating layer 128 and the underlying sacrificial insulating structure 112A selective to the materials forming the ohmic contact 110, the spacers 116 and the metallic anchor and metallic cantilever structure 134A. A timed etch can be implemented to limit the amount of insulating material that is etched away to physically release the cantilever structure 124.

Figure 13A:
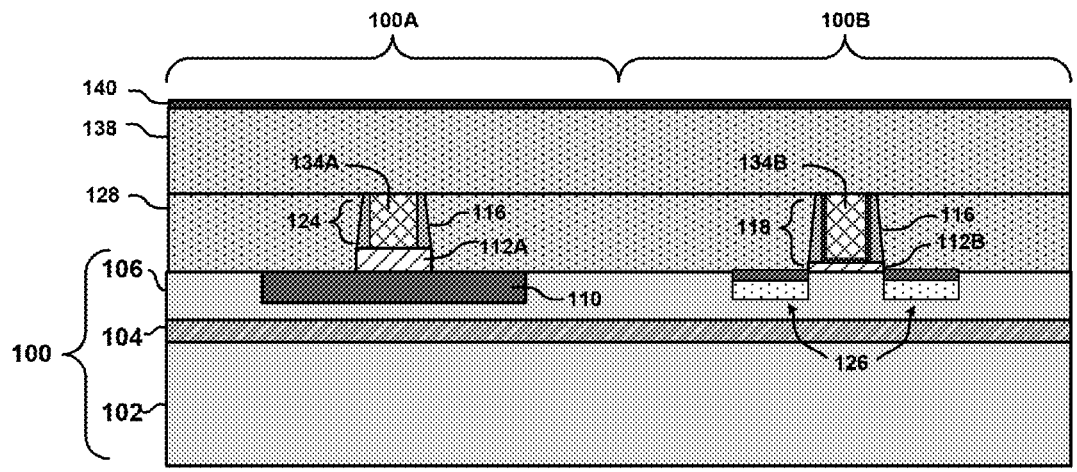

FIGS. 13A~13D schematically illustrate a method to release electromechanical device structures in the electromechanical device region 100A of the substrate, according to another embodiment of the disclosure. In particular, initial steps of the release process are shown in FIG. 13A, wherein FIG. 13A is a schematic cross-sectional side view of the semiconductor structure of FIG. 11 after planarizing the semiconductor structure (of FIG. 11) to remove the layers of metallic material 134 and dielectric material 132 down to the insulating layer 128, and sequentially depositing an insulating layer 138 (e.g., silicon oxide) and a nitride layer 140 on the planarized semiconductor structure, according to an embodiment of the disclosure.

Figure 13B:
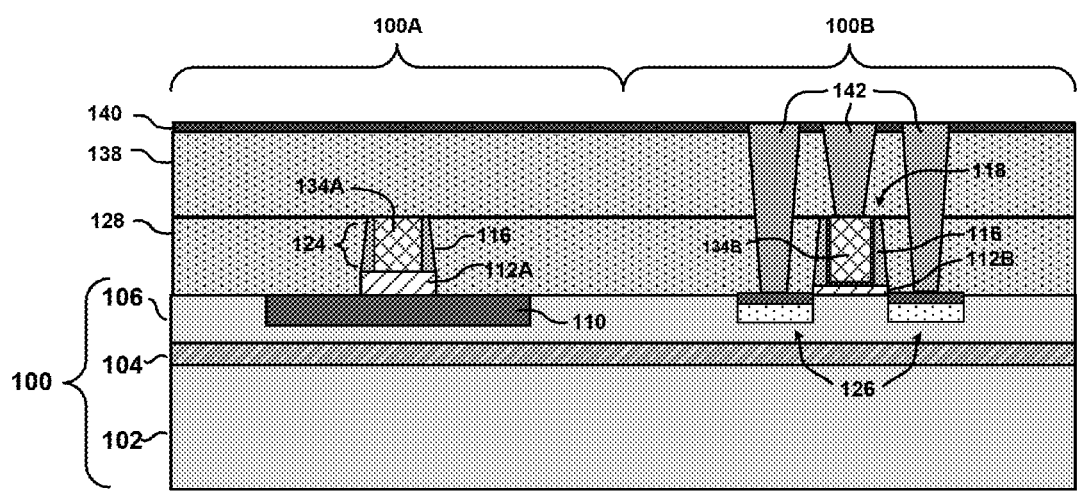

A next step includes forming contacts to the source/drain regions 126 and the gate structures 118 of the FETs in the CMOS device region 100B. For example, FIG. 13B is a schematic cross-sectional side view of the semiconductor structure of FIG. 13A after forming via contacts 142 to the metallic gate electrode 134B and the source/drain regions 126 in the CMOS device region 100B of the substrate 100. The via contacts 142 can be fabricated using known techniques and formed with one or more layers of conductive materials. For example, via holes are etched through the nitride layer 140 and insulating layers 138 and 128 down to the source/drain regions 126 and metallic gate electrode 134B of the gate structure 118. The via holes can be lined with a thin conformal barrier diffusion layer, and then filled with a conductive material such as copper or tungsten, for example.

Figure 13C:
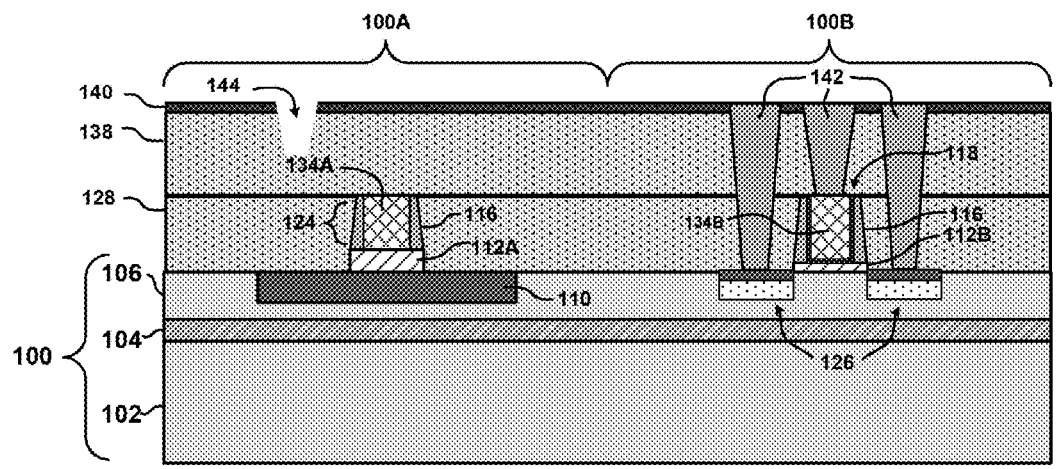
Figure 13D:
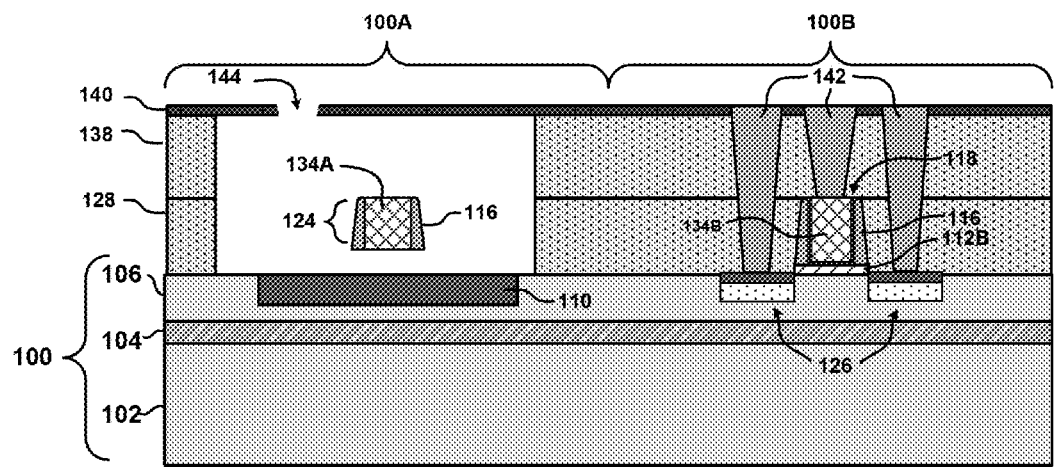

A next step in the release process is to form vent holes in the electromechanical device region 100A which are used to etch the insulating layers and release the cantilever structures. For example, FIG. 13C is a schematic cross-sectional side view of the semiconductor structure of FIG. 13B after forming a vent hole opening 144 through the nitride layer 140 into the insulating layer 138 in the electromechanical device region 100A of the substrate. In addition, FIG. 13D is a schematic cross-sectional side view of the semiconductor structure of FIG. 13C after removing insulating material (e.g., portions of the insulating layers 138 and 128 and the underlying sacrificial insulating structure 112A) through the vent hole opening 144 to release the cantilever structure 124 of the electromechanical device 120.

In one embodiment of the disclosure, an etch process to release the cantilever structure 124 is performed by using the nitride layer 140 as an etch mask, while performing a selective etch process to etch the materials (e.g., silicon oxide) of the insulating layers 128/138 and the underlying sacrificial insulating structure 112A selective to the nitride layer 140 and the ohmic contact 110, the spacers 116 and the metallic anchor and metallic cantilever structure 134A. A timed etch can be implemented to limit the amount of insulating material that is etched away to physically release the cantilever structure 124.

The release methods of FIGS. 12A~12B and FIGS. 13A~13D can be readily implemented in certain designs in which the electromechanical devices are separated from other devices by distances that exceed the given design rule spacing for the fabrication process. This allows a timed etch to be utilized to etch the insulating materials surrounding the cantilever structure 124 to achieve proper release, without adversely affecting surrounding device structures. In other embodiments, when the spacing between devices is relatively close and the undercutting of the insulating layers 128 and 138 must be tightly controlled, other techniques can be implemented to limit the amount of undercutting that occurs during the release etch.

Figure 14A:
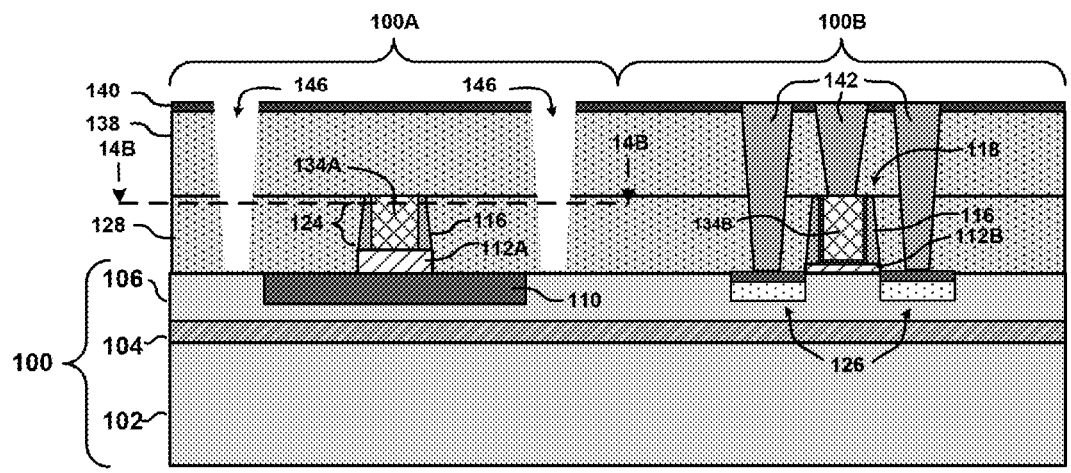
Figure 14B:
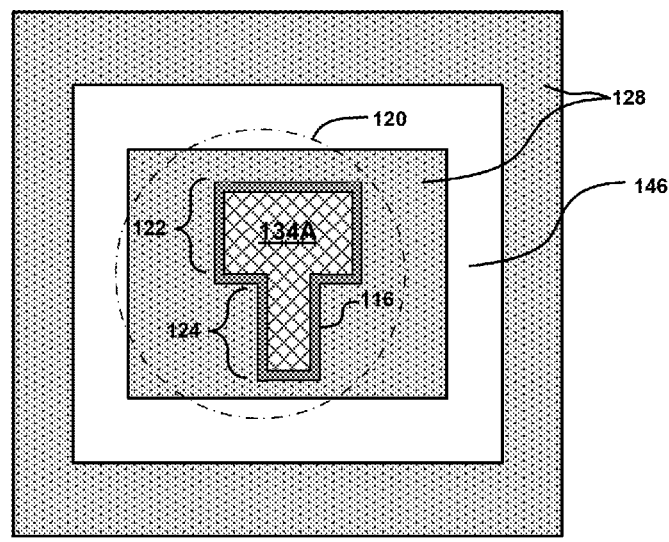

For example, FIGS. 14A~14F schematically illustrate another method to release electromechanical device structures in the electromechanical device region of the substrate, according to an embodiment of the disclosure in which a protective guard ring is utilized to limit the lateral extent (undercutting) of the etch process that releases the cantilever structure 124. In particular, FIG. 14A is a schematic cross-sectional side view of the semiconductor structure of FIG. 13B after performing an etch process to form a guard ring opening 146 around the electromechanical device structure 120 in the electromechanical device region 100A of the substrate. FIG. 14B is a schematic top plan view of the electromechanical device region 100A taken along line 14B-14B in FIG. 14A, showing the guard ring opening 146 formed around the electromechanical device structure 120.

In one embodiment of the disclosure, the guard ring opening 146 can be formed using a process which includes patterning the nitride layer 140 using standard photolithographic techniques to form an etch mask pattern of the guard ring opening 146 in the nitride layer 140, and then using the patterned nitride layer 140 as an etch mask to perform a selective etch process (e.g., RIE) to etch a recess through the insulating layers 138 and 128 down to the SOI layer 106, selective to the nitride layer 140, and thereby form the guard ring opening 146. While FIG. 14B shows the guard ring opening 146 being rectangular-shaped, the guard ring opening 146 can be formed with other shapes, depending on the application and device layout.

Figure 14C:
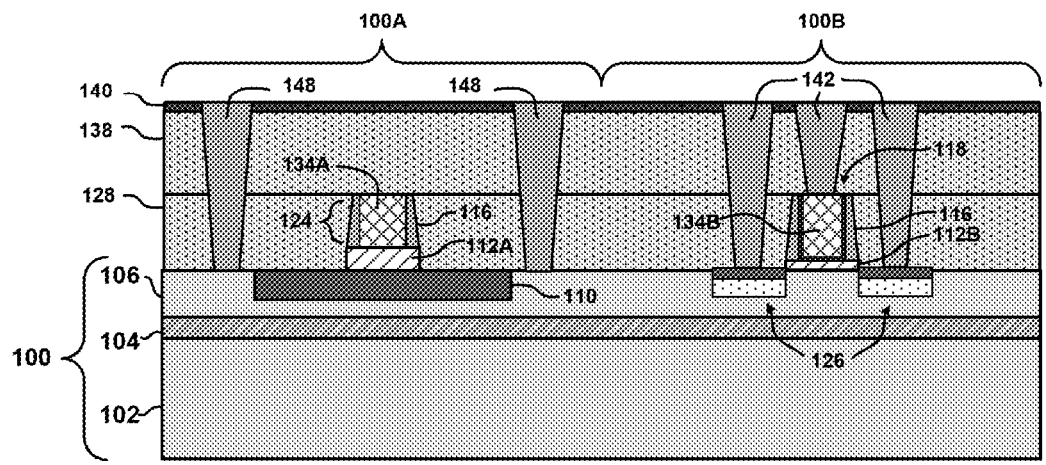

Next, FIG. 14C is a schematic cross-sectional side view of the semiconductor structure of FIG. 14A after filling the guard ring opening 146 with an insulating material to form a guard ring 148 which surrounds the electromechanical device structure 120 in the electromechanical device region 100A of the substrate 100. In one embodiment of the disclosure, the guard ring 148 is formed with an insulating material, which is different from the materials forming the insulating layers 128, 138 and 112A, so that there is high etch selectivity between the guard ring 148 and the insulating layers 128, 138, and 112A. For example, in one embodiment, the guard ring 148 can be formed of silicon nitride when the insulating layers 128, 138, and 112A are formed of silicon oxide. The guard ring 148 can be formed by depositing a silicon nitride material to fill the guard ring opening 146, followed by a CMP process to remove the excess silicon nitride material down to the nitride layer 140.

Figure 14D:
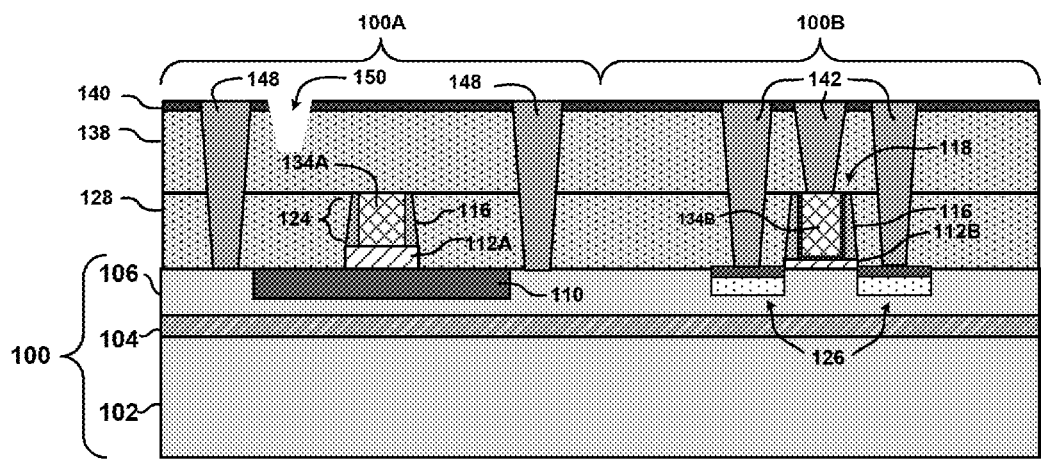
Figure 14E:
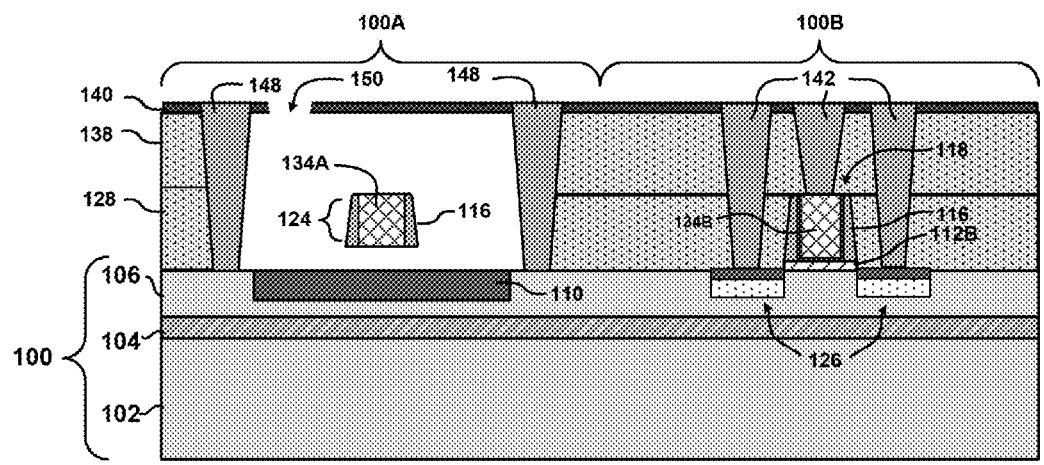

A next step in the release method is to form a vent opening and remove the insulating material within the confines of the guard ring 148 and thereby release the cantilever structure 124. For example, FIG. 14D is a schematic cross-sectional side view of the semiconductor structure of FIG. 14C after forming a vent hole opening 150 through the nitride layer 140 and into the insulating layer 138 within an inner region the guard ring 148 in the electromechanical device region 100A of the substrate 100. Moreover, FIG. 14E is a schematic cross-sectional side view of the semiconductor structure of FIG. 14D after removing insulating material through the vent hole opening 150 to release the cantilever structure 124 of the electromechanical device 120 in the electromechanical device region 100A.

In one embodiment of the disclosure, any suitable dry or wet etch process can be implemented to isotropically etch the materials of the insulating layers 128 and 138 and the underlying sacrificial insulating structure 112A selective to the guard ring 148, for example, to form a cavity within the confines of the guard ring 148 and release the cantilever structure 124. For example, in one embodiment, a wet etch process, such as a buffered oxide etch with a suitable etching chemistry including a buffering agent and hydrofluoric acid (HF), can be used to etch the material (e.g. silicon oxide) of the insulating layers 128, 138, 112A selective to the silicon nitride material of the guard ring 148. The guard ring 148 limits the extent of the undercutting of the insulating layers 128 and 138 during the etch process for releasing the cantilever structure 124.

Figure 14F:
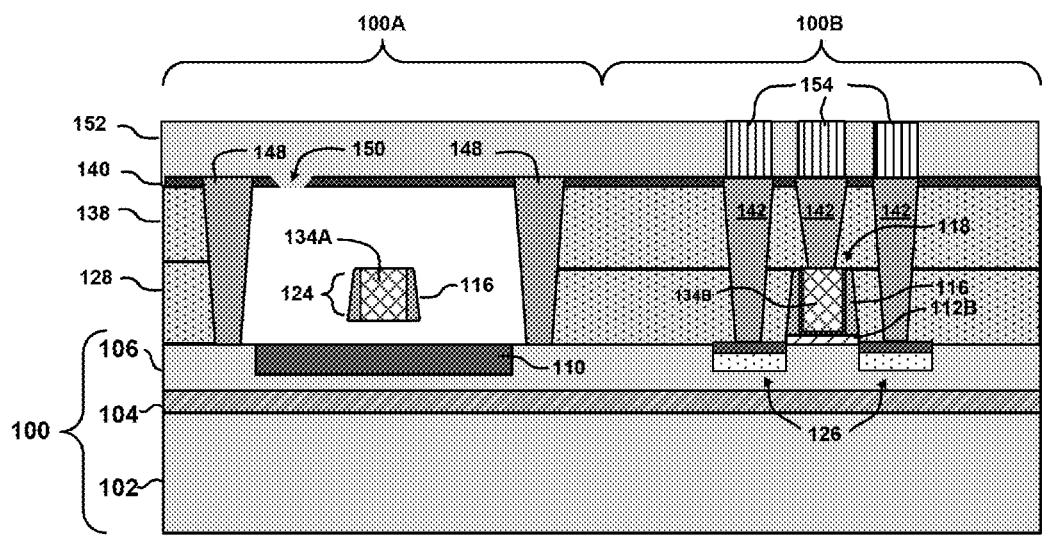

Following the release of the electromechanical devices in the device region 100A, any standard sequence of processing steps can be implemented to fabricate a BEOL structure to interconnect devices within and between the device regions 100A and 100B. For example, FIG. 14F is a schematic cross-sectional side view of the semiconductor structure of FIG. 14E after depositing an insulating layer 152 to seal the vent hole 150 and forming initial via contacts 154 as part of a back-end-of-line process. For example, in one embodiment of the disclosure, the insulating layer 152 and via contacts 154 may be considered the initial Ml level in a BEOL structure, wherein the insulating layer 152 (or ILD (inter-level dielectric) layer) is formed using materials and methods that are commonly utilized for BEOL processing. Moreover, the via contacts 154 can be formed by etching via holes in the insulating layer 152, lining the via holes with a thin barrier diffusion layer, and then filling the via holes with conductive material such as tungsten or copper, for example.

Following the formation of the semiconductor structure of FIG. 14F, any standard sequence of subsequent processing steps can be implemented to complete the fabrication of the BEOL structure and form other elements of the target integrated circuit to be fabricated, the details of which are not needed to understand embodiments as discussed herein.

It is to be appreciated that the illustrative embodiments discussed herein enable the integration of electromechanical devices (e.g., NEMS and/or MEMS devices) with CMOS devices in a FEOL structure using a CMOS process flow that enables the co-fabrication of electromechanical devices and CMOS devices, such as FETs, on the same substrate. For example, in the embodiments discussed herein, electromechanical devices are co-fabricated along with CMOS FET devices as part of a standard replacement metal gate process. While the semiconductor process flows shown in the accompanying figures illustrate the formation of planar FET devices, it is to be understood that electromechanical devices can be co-fabricated with FinFET or trigate devices, for example.

Embodiments of the present disclosure provide various advantages over other co-integration methods. For example, the gap distance between a cantilever and the substrate can be strictly controlled based on the thickness of the underlying sacrificial insulating structure 112A (e.g., oxide layer) as shown in FIGS. 4, 5, 6, and 7. This process enables the formation of very small gaps between the cantilever structure 124 and the contact 110, which allows for the operation of electromechanical devices with low gate control voltages. Moreover, a replacement metal gate process provides the freedom to utilize metallic material to form the cantilever structures during the replacement metal gate process, whether such metallic material is the same or different from the metallic material utilized to form the metallic gate electrodes for CMOS transistor devices.

Moreover, embodiments of the present disclosure provide a simple process flow for a 1-level metal connection structure using a subtractive RIE process (e.g., FIGS. 12A and 12B). In addition, the co-integration of electromechanical devices in a FEOL implementation results in the electromechanical devices being surrounded by the replacement gate metallization as well as the BEOL metallization, which provides additional RF shielding for the electromechanical devices and, hence, less interference from outside signals, which is desirable for RF applications. The co-integration techniques described herein can be implemented in a wide range of applications including, for example, FPGA (field programmable gate array) applications with low leakage and high density, as well as RF applications.

It is to be understood that the methods discussed herein for co-fabricating electromechanical devices and CMOS devices can be incorporated within semiconductor processing flows for fabricating other types of semiconductor devices and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present disclosure can be employed in applications, hardware, and/or electronic systems. Suitable hardware and systems for implementing embodiments of the present disclosure may include, but are not limited to, personal computers, communication networks, electronic commerce systems, portable communications devices (e.g., cell phones), solid-state media storage devices, functional circuitry, etc. Systems and hardware incorporating such integrated circuits are considered part of the illustrative embodiments described herein.

Although illustrative embodiments have been described herein with reference to the accompanying figures, it is to be understood that the present disclosure is not limited to those precise embodiments, and that various other changes and modifications may be made therein by one skilled in the art without departing from the scope of the appended claims.

We claim:
1. A method of forming a semiconductor device, comprising:
    forming an electromechanical device in a first device region of a substrate, the electromechanical device comprising a sacrificial anchor structure and a sacrificial cantilever structure formed of a sacrificial material;

forming a transistor device in a second device region of the substrate, the transistor device comprising a sacrificial gate electrode structure formed of the sacrificial material;

performing a replacement metal gate process to replace the sacrificial gate electrode structure of the transistor device with a metallic gate electrode, and to replace the sacrificial anchor structure and the sacrificial cantilever structure with a metallic anchor structure and a metallic cantilever structure; and releasing the metallic cantilever structure.

2. The method of claim 1, further comprising:
forming a first insulating layer in the first and second device regions of the substrate, the first insulating layer comprising a first portion disposed in the first device region and a second portion disposed in the second device region, the first portion being thicker than the second portion of the first insulating layer;

depositing a layer of the sacrificial material over the first insulating layer in the first and second device regions of the substrate; and patterning the sacrificial material layer to form the sacrificial gate electrode structure of the transistor device and the sacrificial anchor structure and the sacrificial cantilever structure of the electromechanical device.

3. The method of claim 2, further comprising forming an ohmic contact in a surface the substrate below the sacrificial cantilever structure prior to forming the first insulating layer, wherein the first portion of the first insulating layer is disposed on the ohmic contact.

4. The method of claim 2, wherein releasing the metallic cantilever structure comprises etching away the first portion of the first insulating layer between the ohmic contact and the metallic cantilever structure.

5. The method of claim 2, wherein performing the replacement metal gate process comprises:
depositing a second insulating layer over the patterned sacrificial material layer;

planarizing the second insulating layer to expose the sacrificial gate electrode structure of the transistor device and the sacrificial anchor and cantilever structures of the electromechanical device;

etching away the sacrificial gate electrode structure of the transistor device and the sacrificial anchor and cantilever structures of the electromechanical device, which are exposed by the second insulating layer, to form recessed regions; and depositing one or more layers of metallic material to fill the recessed regions with metallic material and form the metallic gate electrode of the transistor device, and form the metallic anchor structure and the metallic cantilever structure of the electromechanical device.

6. The method of claim 5, further comprising forming a gate dielectric layer for the transistor device prior to depositing the one or more layers of metallic material to fill the recessed regions with metallic material.

7. The method of claim 5, wherein depositing one or more layers of metallic material comprises filling the recessed regions with the same metallic material.

8. The method of claim 5, wherein depositing one or more layers of metallic material comprises:

depositing a layer of first metallic material to fill a first recessed region with the first metallic material and form the metallic gate electrode of the transistor device; and depositing a layer of second metallic material to fill a second recessed region with the second metallic material, which is different from the first metallic material, and form the metallic anchor structure and the metallic cantilever structure of the electromechanical device.

9. The method of claim 5, further comprising:
patterning the one or more layers of metallic material to form a vent opening in the first device region of the substrate to expose the second insulating layer; and isotropically etching the exposed second insulating layer and the first portion of the first insulating layer through the vent opening in the first device region of the substrate to release the metallic cantilever structure.

10. The method of claim 5, further comprising:
planarizing the one or more layers of metallic material down to the second insulating layer;

forming a third insulating layer on the second insulating layer;

forming a fourth insulating layer on the third insulating layer;

patterning the fourth insulating layer to form a vent opening in the fourth insulating layer to expose a portion of the third insulating layer in the first device region of the substrate; and isotropically etching the exposed third and second insulating layers and the first portion of the first insulating layer through the vent opening in the first device region of the substrate to release the metallic cantilever structure.

11. The method of claim 10, wherein the first, second and third insulating layers are formed of the same insulating material and wherein the fourth insulating layer is formed of insulating material which is different from the insulating material of the first, second and third insulating layers.

12. The method of claim 10, further comprising forming via contacts to drain and source regions and to the metallic gate electrode of the transistor device in the second device region by etching via holes through the fourth, third and second insulating layers and filling the via holes with conductive material.

13. The method of claim 10, further comprising forming a guard ring in the first device region surrounding the electromechanical device, prior to the isotropic etch process to release the metallic cantilever structure.

14. The method of claim 13, wherein forming a guard ring comprises:
patterning the fourth insulating layer to form a guard ring pattern the fourth insulating layer;

etching the third and second insulating layers down to the substrate using the patterned fourth insulating layer as an etch mask to form a guard ring opening; and filling the guard ring trench with an insulating material, which is different from the third and second insulating layers, to form the guard ring;

wherein isotropically etching the exposed third and second insulating layers and the first portion of the first insulating layer through the vent opening in the first device region of the substrate to release the metallic cantilever structure is performed using the guard ring as a lateral etch stop.

* * * * *